US011041901B2

(12) United States Patent
Pakala et al.

(10) Patent No.: US 11,041,901 B2
(45) Date of Patent: Jun. 22, 2021

(54) UNCLAMPED INDUCTOR SWITCHING TEST AT WAFER PROBE

(71) Applicant: Texas Instruments Incorporated, Dallas, TX (US)

(72) Inventors: Pavan Pakala, Mckinney, TX (US); Indumini Ranmuthu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 240 days.

(21) Appl. No.: 16/297,972

(22) Filed: Mar. 11, 2019

(65) Prior Publication Data

US 2020/0292610 A1 Sep. 17, 2020

(51) Int. Cl.
G01R 31/26 (2020.01)
G01R 31/28 (2006.01)
G01R 1/073 (2006.01)
G06F 13/40 (2006.01)

(52) U.S. Cl.
CPC ..... *G01R 31/2621* (2013.01); *G01R 1/07342* (2013.01); *G01R 1/07364* (2013.01); *G01R 31/2601* (2013.01); *G01R 31/2633* (2013.01); *G01R 31/2831* (2013.01); *G06F 13/4022* (2013.01)

(58) Field of Classification Search
CPC ............ G01R 31/2621; G01R 31/2831; G01R 31/2601; G01R 1/07364; G01R 1/07342; G01R 31/2633; G01R 31/2841; G06F 13/4022
USPC ........................................ 324/754.07, 762.05
See application file for complete search history.

(56) References Cited

U.S. PATENT DOCUMENTS

2010/0327893 A1* 12/2010 Vilas Boas ........ G01R 31/2884
324/754.07
2018/0299498 A1* 10/2018 Grund .................. G01R 31/002

* cited by examiner

*Primary Examiner* — Farhana A Hoque
(74) *Attorney, Agent, or Firm* — Rose Alyssa Keagy; Charles A. Brill; Frank D. Cimino

(57) ABSTRACT

A wafer test probe system, probe card, and method to test back-to-back connected first and second transistors of a wafer. The probe card includes a waveform generator circuit and probe needles to couple the waveform generator circuit to provide a first pulse signal of a first polarity using a body diode of the first transistor to test the second transistor, and to provide a second pulse signal of a second polarity using a body diode of the second transistor to the test the first transistor. One example includes a resistor connected between the waveform generator circuit and one of the probe needles. The probe card includes a probe needle to connect a sense transistor of the wafer to the first transistor during wafer probe testing.

20 Claims, 5 Drawing Sheets

UNCLAMPED INDUCTOR SWITCHING TEST AT WAFER PROBE

BACKGROUND

Power circuits are used in a variety of applications, such as switching power supplies for DC-DC conversion and controlled switching of power for universal serial bus (USB) port controllers. USB port controller power circuits that deliver power from a source to a USB compatible device often includes a blocking transistor and a high side hot-swap transistor connected back-to-back between a power supply and the USB port connector. Early identification of defective transistors helps to reduce defective parts per million (DPPM-) during manufacturing of USB port connectors and other devices with power circuits. Field effect transistors (FETs) can be evaluated at final device testing using unclamped inductive switching (UIS) that simulates the effect of an inductive load during transistor switching. Final testing that uses UIS, however, uses additional circuitry that consumes die area in the device. In addition, UIS testing can adversely affect a sense transistor (e.g., sense FET) connected with the tested FET and/or the presence of a sense transistor can lead to false UIS test failures due to coupling of the test signals into the sense transistor.

SUMMARY

A described system includes a chuck apparatus to support a wafer with a first transistor and a second transistor, and a probe card with a waveform generator circuit that provides a first pulse signal of a first polarity to test the second transistor and provides a second pulse signal of a second polarity to test the first transistor.

A described wafer test probe card includes a first probe needle to couple with a first source of a first transistor of a wafer when the wafer is engaged with the wafer test probe card. The probe card also includes a second probe needle to couple with a first gate of the first transistor, a third probe needle to couple with a first drain of the first transistor, and a waveform generator circuit to provide a pulse signal to the first and third probe needles to test the first transistor when the wafer is engaged with the wafer test probe card. The probe card includes a resistor connected between the waveform generator circuit and the first probe needle.

A described method includes engaging a wafer with a wafer test probe card to couple a waveform generator circuit of the wafer test probe card to back-to-back connected first and second transistors of the wafer, providing a first pulse signal of a first polarity to the back-to-back connected pair of transistors to test the second transistor, and providing a second pulse signal of a second polarity to the back-to-back connected pair of transistors to test the first transistor.

DETAILED DESCRIPTION

Figure 1:
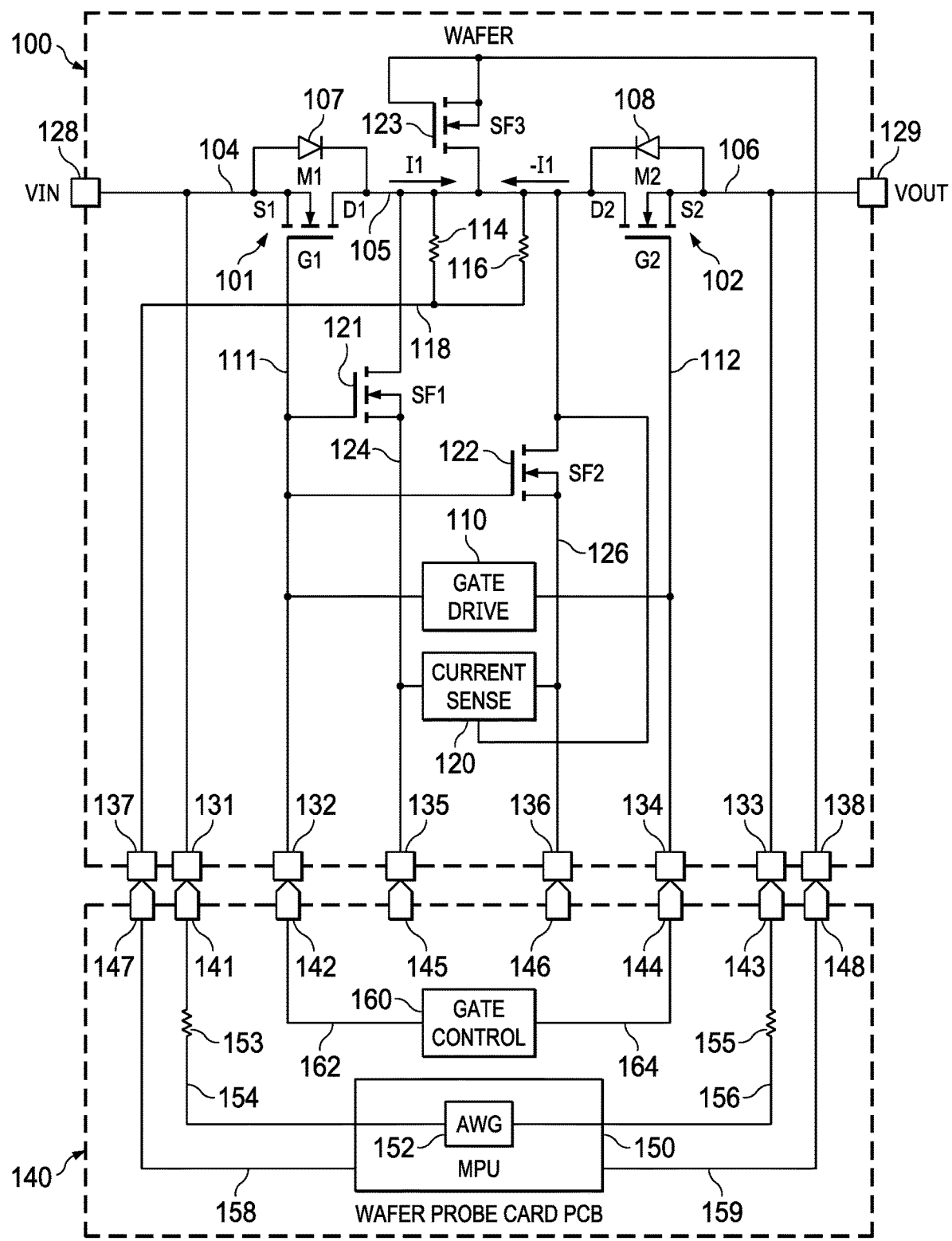
FIG. 1 is a schematic diagram of a wafer test probe card with probe needles engaged with a wafer.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Described example systems, methods and wafer test probe cards use first and second waveform pulse signals at wafer probe to test individual back-to-back connected transistors using a body diode of a first transistor for current conduction while stressing a second transistor, and vice versa. This approach can implement UIS or other testing to identify transistor defects earlier in the manufacturing process and mitigates or avoids additional final test circuitry that consumes die area. UIS testing at probe provides valuable defect signature data for post analysis and provides cost benefits over UIS testing at final test. Described probe card examples also include electrical connections and probe needles to short sense transistors during probe testing. This mitigates or avoids test signal coupling into sense transistors and false UIS failures. Ballast resistors are included in certain probe card examples to mitigate or prevent probe card damage in production. In one example, the wafer probe test system includes short profile pogo pins to facilitate high current testing. Described examples provide benefits in use for testing USB systems and power circuits having a back-to-back transistor configuration with a first transistor operating as a blocking transistor, and a second transistor referred to as a high side hot-swap transistor. The disclosed apparatus and techniques can be used in other applications, including wafer probe testing of other circuits, including testing single transistors.

FIG. 1 shows a wafer 100 with a back-to-back transistor configuration that includes a first transistor 101 (e.g., a blocking transistor) and a second transistor 102 (e.g., a high side hot-swap transistor). The circuitry of the wafer 100 can be used in a variety of system applications, including USB-PD compatible port controller power circuits with low on state resistance transistors 101 and 102 to efficiently implement high voltage fast charging of a connected USB device (not shown). The first transistor 101 in one example is a metal oxide semiconductor field effect transistor (MOSFET) transistor (labeled M1) and the second transistor 102 is a MOSFET transistor (labeled M2). The transistors 101 and 102 are connected back-to-back in series with one another. The transistors 101 and 102 in this example are n-channel metal oxide semiconductor (e.g., NMOS) field effect transistors (FETs). Other types of transistors can be used in other implementations, such as bipolar transistors, p-channel FETs, etc. The first transistor 101 is connected between an input node 104 and a first node 105. The input node 104 in one example is connected to receive an input voltage signal VIN, for example, from a power supply (not shown in FIG. 1).

The first transistor 101 includes a first terminal (e.g., a first drain labeled D1 in FIG. 1) that is connected to the first node 105, a second terminal (e.g., a first source labeled S1) that is connected to the input node 104, and a control terminal (e.g., a first gate labeled G1). The second transistor 102 includes a second drain (labeled D2) connected to the first node 105 and thus to the first drain D1. In addition, the second transistor 102 includes a second source (labeled S2) connected to an output node 106, and a second gate (labeled G2). The first transistor 101 in this example includes a body diode 107, with an anode connected to the input node 104 and a cathode connected to the first node 105. The second transistor 102 includes a body diode 108, with an anode connected to the output node 106, and a cathode connected to the first node 105. In operation, the output node 106 is provides an output voltage signal VOUT to a load, such as a USB compatible device connected to a USB port (not shown in FIG. 1).

The wafer 100 is schematically illustrated in FIG. 1 by a dashed box labeled 100 that includes an example power circuit on/in the wafer 100, where the wafer 100 also includes other circuitry including other power circuits (not shown). The example wafer 100 in FIG. 1 includes a gate drive circuit 110 that operates the transistors 101 and 102. The gate control terminal G1 of the first transistor 101 is connected to a first control node 111. The first transistor 101 operates according to a gate-source voltage established by a voltage signal at the first control node 111. The gate control terminal G2 of the second transistor 102 is connected to a second control node 112. The second transistor 102 operates according to a gate-source voltage established by a voltage signal at the second control node 112. The wafer 100 also includes pull down resistors 114 and 116 respectively connected between the first node 105 and a resistor node 118. The gate drive circuit 110 in one example provides individual gate control signals to the control nodes 111 and 112 for individual operation of the first and second transistors 101 and 102.

The example wafer 100 also includes a current sensing circuit 120, as well as a first sense transistor 121 (labeled SF1) and a second sense transistor 122 (labeled SF2). In the illustrated example, the first and second sense transistors are p-channel MOSFETs, although other transistor types can be used in other implementations. The wafer 100 also includes a third sense transistor 123 (labeled SF3) with a drain connected to the first node 105. The first sense transistor 121 includes a drain connected to the first node 105, a gate connected to the first control node 111, and a source connected to a first input 124 of the current sense circuit 120. The second sense transistor 122 includes a drain connected to the first node 105, a gate connected to the first control node 111, and a source connected to a second input 126 of the current sense circuit 120. The sense transistors 121 and 122 in one example are of different physical sizes to conduct different currents that are proportional to a current I1 flowing through the first transistor 101.

The current sense circuit 120 senses the source-drain currents of the first and second sense transistors 121 and 122 to control operation of the power circuit of the wafer 100. In one example, when the first transistor 101 is substantially enhanced by a proper gate-source voltage signal applied to the first gate G1 relative to the first source S1 the first and second sense transistors 121, 122 conduct currents that are proportional to the current I1 flowing in the first transistor 101 (and hence the current flowing through the second transistor 102). In one example, the current sensing circuit 120 monitors the drain-source voltages of the first and second sense transistors 121 and 122 during circuit start up to determine if the first transistor 101 is fully enhanced before turning on the second transistor 102. The wafer 100 in one implementation includes further circuitry (not shown) to quickly turn off the high side hot-swap second transistor 102 if the amplitude of the first transistor current I1 exceeds a reference value.

The wafer 100 is schematically shown engaged with probe needles of a wafer probe card in FIG. 1 during wafer probe testing. The wafer probe testing in one example is implemented using a wafer probe testing system described further below in connection with FIG. 3. As shown in FIG. 1, the wafer 100 also includes conductive pads, for example, copper or aluminum features exposed along a top side of the wafer 100 to allow electrical connection to one or more circuit nodes. In one example, the wafer 100 includes an input voltage conductive pad 128 to receive the input voltage signal VIN at the input node 104, and an output voltage conductive pad 129 to provide external access to the output voltage signal VOUT from the output node 106. The wafer 100 in this example also includes conductive pads 131-138 to provide external connectivity with a wafer probe card 140 for wafer probe testing. The example probe card 140 in one example is a printed circuit board (PCB) structure with probe needles 141-148 positioned on the PCB in locations corresponding to the respective conductive pads 131-138. As shown in FIG. 1, the probe card 140 is positioned during wafer probe testing such that the conductive pads 131-138 are engaged by the corresponding probe needles 141-148. In this position, the respective probe needles 141-148 physically engage with, and provide electrical connection to, the corresponding conductive pads 131-138.

The wafer test probe card 140 includes test circuitry electrically coupled with the probe needles 141-148. In operation, the test circuitry interacts with the circuitry of the probed wafer 100 when the probe card 140 is positioned with the probe needles 141-148 electrically contacting (e.g., mechanically engaged with) the corresponding conductive pads 131-138. A first probe needle 141 in this example is positioned to engage the first conductive pad 131 to couple with the first source S1 of the first transistor 101 when the wafer 100 is engaged with the wafer test probe card 140. A second probe needle 142 is positioned to engage the second conductive pad 132 to couple with the first gate G1 of first transistor 101 when the wafer 100 is engaged with the wafer test probe card 140. A third probe needle 143 of the wafer test probe card 140 is positioned to engage the third conductive pad 133 to couple with the first drain D1 when the wafer 100 is engaged with the wafer test probe card 140. In the back-to-back connected configuration of the transistors 101 and 102 in FIG. 1, the third conductive pad 133 is coupled to the first drain D1 through the source-drain path of the second transistor 102 and through the second body diode 108 of the second transistor 102. In an alternate implementation with a single transistor, a third conductive pad is directly connected to the drain of the single transistor as described below in connection with FIG. 6.

The wafer test probe card 140 also includes a processor circuit 150, such as a microprocessor unit (MPU), with a waveform generator circuit 152 (e.g., an arbitrary waveform generator or AWG). The waveform generator circuit 152 is configured to provide a pulse signal, such as a current signal, to the first and third probe needles 141 and 143 to test the first transistor 101 when the wafer 100 is engaged with the wafer test probe card 140. Due to the back-to-back interconnection of the first and second transistors 101, 102, the application of a first pulse signal as a voltage signal to the probe needles 141, 143 in one example provides a voltage signal that conducts current through the first transistor 101 using the body diode 108 of the second transistor 102. In this manner, the probe testing can separately evaluate the first transistor 101 during wafer probe without addition of extra circuitry. In the illustrated example, moreover, the wafer test probe card 140 includes a first ballast resistor 153 connected between a first output 154 of the waveform generator circuit 152 and the first probe needle 141, as well as a second ballast resistor 155 connected between a second output 156 of the waveform generator circuit 152 and the third probe needle 143. In practice, the ballast resistors 153, 155 protect the waveform generator circuit 152 and other circuitry of the wafer test probe card 140 during use, such as if one of the probe needles 141, 143 fails to properly engage the corresponding conductive pad 131, 133.

The wafer test probe card 140 in FIG. 1 also includes a fourth probe needle 144 positioned to engage the fourth conductive pad 134 to couple with the second gate of the second transistor 102 when the wafer 100 is engaged with the wafer test probe card 140. The third probe needle 143 is configured to connect to the second source S2 of the second transistor 102 by engagement with the third conductive pad 133 when the wafer 100 is engaged with the wafer test probe card 140. The waveform generator circuit 152 in this example is configured to provide a first pulse signal of a first polarity to the waveform generator outputs 154, 156 (e.g., the voltage at the output 154 is greater than the voltage of the output 156) to test the second transistor 102. The first pulse signal uses the conductive path provided by the first body diode 107 as a test circuit path to test the second transistor 102 without any additional dedicated test circuitry.

The waveform generator circuit 152 is also configured to provide a second pulse signal of a different second polarity (e.g., the voltage at the output 154 is less than the voltage of the output 156) to the first and second waveform generator outputs 154, 156 to test the first transistor 101. The second pulse signal uses the conductive path provided by the second body diode 108 as a test circuit path to test the first transistor 101 without any additional dedicated test circuitry. In one implementation, the waveform generator circuit 152 is configured to provide a first discharge pulse signal of the second polarity to the waveform generator outputs 154, 156 at the end of the first pulse signal (e.g., 404 in FIG. 4 described further below) to discharge the second transistor 102. In addition, the waveform generator circuit 152 in this example is configured to provide a second discharge pulse signal of the first polarity to the first and second waveform generator outputs 154, 156 at the end of the second pulse signal to discharge the first transistor 101.

The example wafer test probe card 140 in FIG. 1 also includes a fifth probe needle 145 positioned to engage a fifth conductive pad 135 of the wafer 100 to couple with the sense transistor source of the sense transistor 121 of the wafer 100 when the wafer 100 is engaged with the wafer test probe card 140. The wafer test probe card 140 further includes a sixth probe needle 146 positioned to engage a sixth conductive pad 136 of the wafer 100 to couple with the second sense transistor source of the sense transistor 122 when the wafer 100 is engaged with the wafer test probe card 140. The fifth probe needle 145 and the sixth probe needle 146 are connected to the first probe needle 141 by conductive features (e.g., trances and/or vias) of the wafer test probe card PCB structure 140.

The pulse signals in one example are UIS current pulses that do not decay quickly due to lack of a discharge path in the tested portion of the wafer 100. The wafer test probe card 140 connects the sense transistor sources to the input node 104 via the respective probe needles 145 and 146 to prevent the extended test pulses from stressing the sense transistors 121 and/or 122. In addition, the lack of test circuit discharge path allows the test pulse voltage to inadvertently stress the gate oxide of the sense transistors 121 and/or 122. The use of the discharge pulses mitigates or avoid gate oxide degradation. In one example, the discharge pulses are opposite polarity current pulses, such as 500 mA pulses for 20 μs. Example test pulse signals are illustrated and described further below in connection with FIG. 4.

The wafer test probe card 140 in FIG. 1 also includes a seventh probe needle 147 positioned to engage the seventh conductive pad 137. The MPU 150 in this example includes a reference connection 158 connected to the seventh probe needle 147 to allow the MPU 150 to connect the first node 105 to a ground or other reference voltage through the resistors 114 and 116. The MPU 150 also includes a measurement connection 159 to an eighth probe needle 148 that engages an eighth conductive pad 138 connected to the third sense transistor 123 to allow the MPU 150 to measure a voltage of the first node 105.

The wafer test probe card 140 also includes a gate control circuit 160 with a first gate control output 162 connected to the second probe needle 142, and a second gate control output 164 connected to the fourth probe needle 144. The gate control circuit 160 selectively provides gate control signals to the gates G1 and G2 of the respective first and second transistors 101 and 102. In one example, the gate control circuit 160 provides a voltage signal to the second gate control output 164 to turn the second transistor 102 off before the waveform generator circuit 152 provides the first pulse signal to the first and second waveform generator outputs 154, 156. The gate control circuit 160 in this example provides another voltage signal to the first gate control output 162 to turn the first transistor 101 off before the waveform generator circuit 152 provides the second pulse signal (e.g., 406 in FIG. 4 described further below) to the first and second waveform generator outputs 154, 156. In one example, the gate control circuit 160 controls the voltages at the first and second control nodes 111 and 112 to turn both the first and second transistors 101 and 102 off during the UIS testing, including before, during, and after the waveform generator circuit 152 provides the pulse signals. In other implementations, the gate control circuit 160 turns one of the transistors 101, 102 on prior to the waveform generator pulse signal, and turns that transistor off at or near the beginning of the pulse signal from the waveform generator circuit 152 (e.g., within a few ms).

Figure 2:
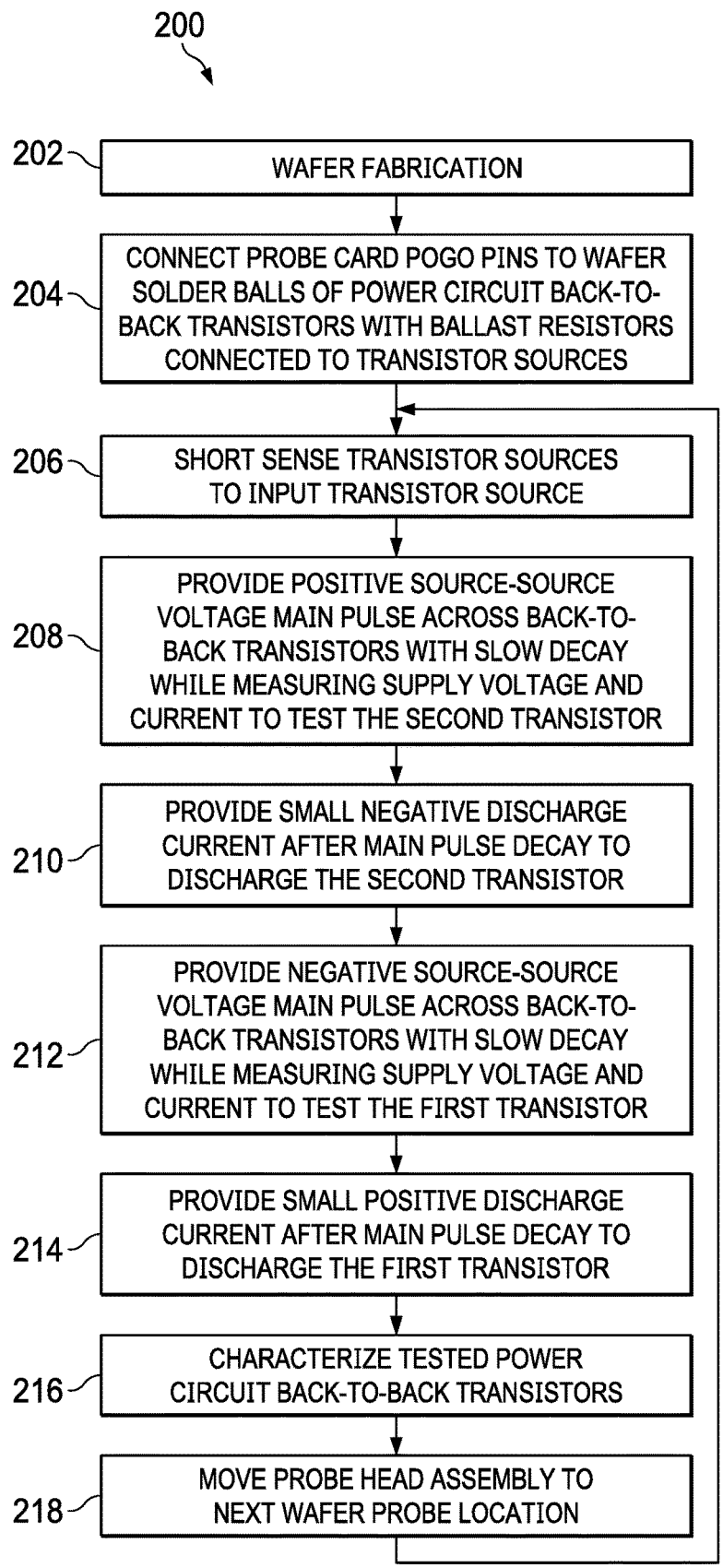
FIG. 2 is a flow chart of a wafer probe test method.

FIG. 2 shows an example wafer probe test method 200. The method 200 can be implemented in a variety of wafer probe test systems, an example of which is described further below in connection with FIG. 3. The method 200 begins at 202 in FIG. 2 with wafer fabrication. Any suitable semiconductor processing steps can be performed in the wafer fabrication at 202 in order to produce a semiconductor structure with one or more transistors formed on or in a semiconductor substrate. In one example, the wafer fabrication at 202 provides a processed wafer structure with transistors (e.g., one or more power circuits as shown in FIG. 1 above) and metallization structures including externally accessible conductive pads (e.g., conductive pads 131-138 in FIG. 1).

The processed wafer in one example includes multiple probable circuits, for example, the individual power circuits associated with prospective die areas to be subsequently separated into dies in constructing package semiconductor devices (e.g., integrated circuits or ICs). At wafer probe testing (e.g., method 200 in FIG. 2), the wafer has not yet been simulated or separated into individual dies, and wafer probe test equipment can probe one or more specific circuits and perform testing thereof by engaging probe needles (e.g., probe needles 141-148 in FIG. 1) with corresponding conductive pads (e.g., 131-138) to electrically connect test circuitry with a power circuit or other circuitry of the processed wafer. As previously noted, wafer probe testing advantageously identifies one or more problems in individual circuits of a wafer before simulation and packaging, thereby providing valuable information earlier in the process compared with final device testing. In one example, as described in connection with the method 200, the wafer probe testing system may include a probe head assembly that is movable or translatable relative to the processed wafer under test in order to sequentially probe multiple circuits of the processed wafer.

At 204 in FIG. 2, the method 200 includes engaging the wafer (e.g., wafer 100) with a wafer test probe card (e.g., 140 in FIG. 1). Engaging the wafer with the wafer test probe card at 204 in one example couples a waveform generator circuit of the wafer test probe card (e.g., waveform generator circuit 152) to back-to-back connected first and second transistors 101, 102 of the wafer 100. An example of the interconnection through mechanical engagement at 204 is schematically shown in FIG. 1. In one example, the engagement at 204 includes connecting probe card pogo pins to wafer solder balls of back-to-back connected transistors of a power circuit, with ballast resistors connected to the sources of the first and second transistors. FIG. 1 shows one example including ballast resistors 153 and 155 connected between the outputs 154, 156 of the waveform generator circuit 152 and the sources S1, S2 of the first and second transistors 101 and 102, respectively.

The method 200 includes shorting sense transistor sources to the source of the input transistor at 206. The schematic diagram of the wafer test probe card 140 in FIG. 1 shows one example, in which the sources of the first and second sense transistors 121, 122 are connected via a corresponding fifth and sixth conductive pads 135, 136 and probe needles 145, 146 to one another and to the source S1 of the first (e.g., input) transistor 101 when the wafer test probe card 140 is engaged with the wafer 100. This shorts the sense transistor sources to the source of the input transistor and mitigates or prevents damage to the sense transistors 121, 122 during subsequent application of test pulse signals for testing the first and second transistors 101, 102, respectively.

At 208 and 212, the method includes providing first and second pulse signals to respectively test the second and first transistors in the illustrated example. The illustrated method 200 also includes discharge pulses at 210 and 214 after the main pulses in order to discharge the tested circuitry, at least partially, prior to moving the wafer test probe card 140 to probe another circuit of the tested wafer. In other examples, only a single transistor is tested, and the second main pulse and second discharge pulse can be omitted. In another example, one or both discharge pulses (e.g., 210 and/or 214) are omitted. The illustrated example, moreover, uses the body diodes of the back-to-back connected transistors 101, 102 to facilitate wafer probe testing for UIS or other evaluation of the wafer transistors 101 and 102, without requiring additional test circuitry on or in the processed wafer.

At 208, the method 200 includes providing a first pulse signal of a first polarity (e.g., positive) to the back-to-back connected pair of transistors 101, 102 to test the second transistor 102. In one example, the first pulse signal is provided by a waveform generator circuit (e.g., 152 in FIG. 1), and the pulse signal is a current pulse that creates a voltage between the first source S1 at the input node 104 and the second source S2 at the output node 106. In the illustrated example, the first pulse signal is a positive current pulse, in which the waveform generator circuit 152 delivers a positive current to the first output 154 to cause the voltage at the input node 104 to be higher than the voltage at the output node 106. This first pulse conducts current through the body diode 107 of the first transistor 101 (e.g., current I1 shown in FIG. 1). The first pulse current is conducted through the second transistor 102. The method 200 also includes providing a first discharge pulse signal at 210 of the second polarity (e.g., a small negative current) to the transistors 101, 102 at the end of the first pulse signal (e.g., 404 in FIG. 4 below) to discharge the second transistor 102. In one example, the waveform generator circuit 152 provides the first discharge pulse signal by delivering a small current to the second waveform generator output 156 (e.g., 41 in FIG. 1) that conducts through the second body diode 108 and through the drain-source path of the first transistor 101.

The method 200 continues at 212 with providing a second pulse signal of the second polarity (e.g., negative) to the back-to-back connected pair of transistors 101, 102 to test the first transistor 101. In one example, the waveform generator circuit 152 in FIG. 1 provides the second pulse signal at 212 as a negative current pulse to the second waveform generator output 156. The second pulse signal causes the voltage at the input node 104 to be lower than the voltage at the output node 106 to the pulse conduct current through the body diode 108 of the second transistor 102 and through the first transistor 101. The method 200 continues at 214 with providing a second discharge pulse signal of the first polarity (e.g., positive) to the transistors 101, 102 at the end of the second pulse signal to discharge the first transistor 101. At 216, the back-to-back tested transistors 101 and 102 are characterized according to measured values obtained during the testing at 208-214, and the probe head assembly is moved to the next wafer probe location at 218. Thereafter, the testing at 206-216 is repeated at the new probe location, and the method 200 continues until all desired probe locations have been visited and tested.

Figure 3:
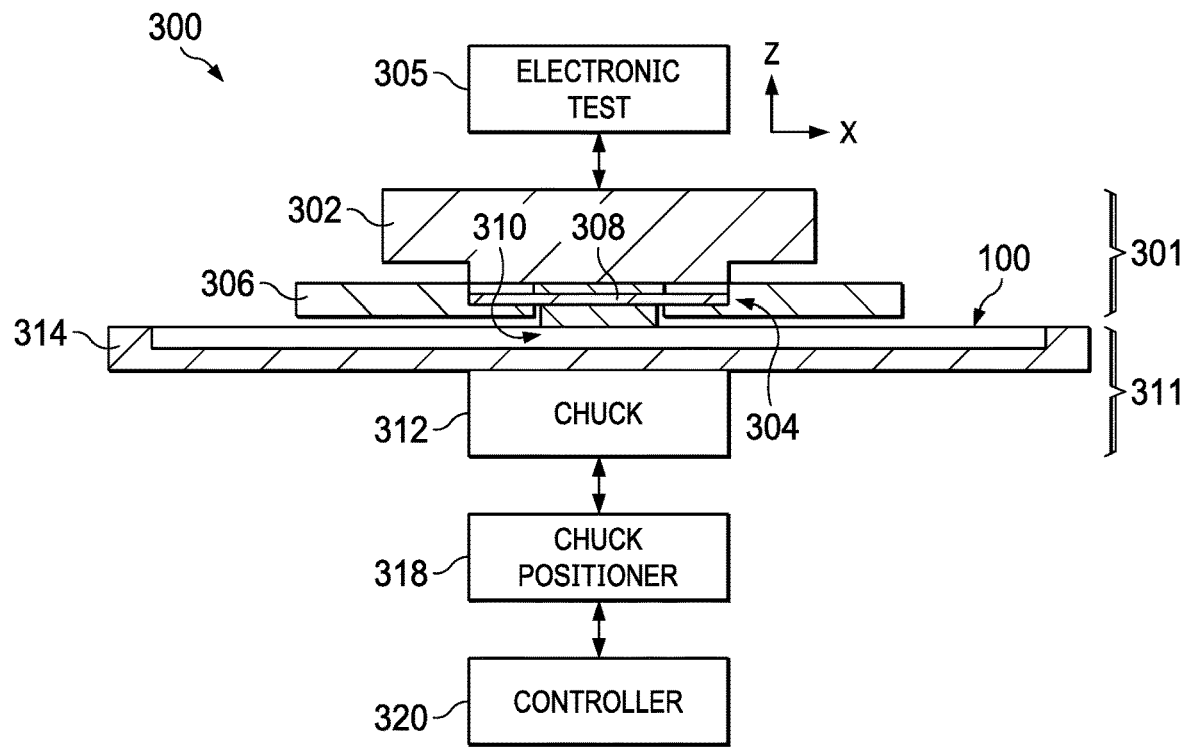
FIG. 3 is a simplified diagram of an automated wafer probe test system.

FIG. 3 shows an automated wafer probe test system or prober 300 which can be used to implement the test method 200 for testing a wafer. The system 300 includes a probe head assembly 301 with a test head 302. The test head 302 includes conductive connections 304, such as pogo pins, that are electrically connected to an electronic test circuit 305. In one example, the conductive connections 304 are short profile pogo pins to facilitate high current testing. The conductive connections 304 extend into a recess in a head plate 306. As an example, the test head 302 and the head plate 306 can be ceramic material. The probe head assembly 301 also includes a probe card 308 seated in the head plate recess. The probe card 308 in one example is an implementation of the wafer probe test PCB 140 of FIG. 1 above. The probe card 308 includes top side pads electrically connected to the pogo pin conductive connections 304 of the test head 302. The probe card 308 includes probe needles 310 that extend downward (e.g., along the −Z direction in FIG. 3) through an opening in the bottom of the head plate 306 to contact a wafer under test (e.g., the wafer 100 of FIG. 1). The probe needles 310 in one example are an implementation of the wafer probe needles 141-148 of FIG. 1. The electronic test circuit 305 in one example is configured to implement electrical testing of a probed wafer, such as UIS testing of wafer transistors, tests for short circuit and open circuit faults and/or other operational functional tests.

The system 300 also includes a chuck apparatus 311 with a chuck 312 and an attached carrier 314 configured to support the wafer 100. The chuck 312 is mechanically supported and positioned by an attached chuck positioner apparatus 318. The chuck positioner apparatus 318 is configured to move or otherwise translate the chuck apparatus 311 between various chuck positions that engage conductive pads of select locations of the wafer 100 with probe needles 310 of the probe card 308. As an example, the chuck positioner apparatus 318 can include linear or rotary servos, positioner actuators and mechanical supporting structures to move the chuck 312, along with the associated carrier 314 and an installed wafer 100, to any position and orientation in a three-dimensional space relative to the position of the probe head assembly 301 and the probe needles 310 thereof.

The wafer probe test system 300 also includes a central controller 320. The controller 320 can include one or more processor components and associated electronic memory (not shown). In one example, the electronic memory of the controller 320 stores processor executable program instructions to implement automatic wafer probe testing and translation of the apparatus 311 during transitions between probe locations on the wafer 100 and to allow installation and removal of processed wafers for probe testing. During testing, the controller 320 sends suitable signals or commands to the positioner 318 to position the chuck apparatus 311 in a location to contact the wafer 100 with the probe needles 310. In one example, the controller 320 exchanges data and/or messages with the electronic test circuit 305 to control wafer probe testing to implement one or more test routines or programs, such as UIS tests, short circuit detection, open circuit detection, operational circuit testing, etc. In one example, the controller 320 implements automated UIS testing of a single transistor of the wafer 100, or UIS testing of first and second transistors 101, 102 according to the method 200 of FIG. 2.

Figure 4:
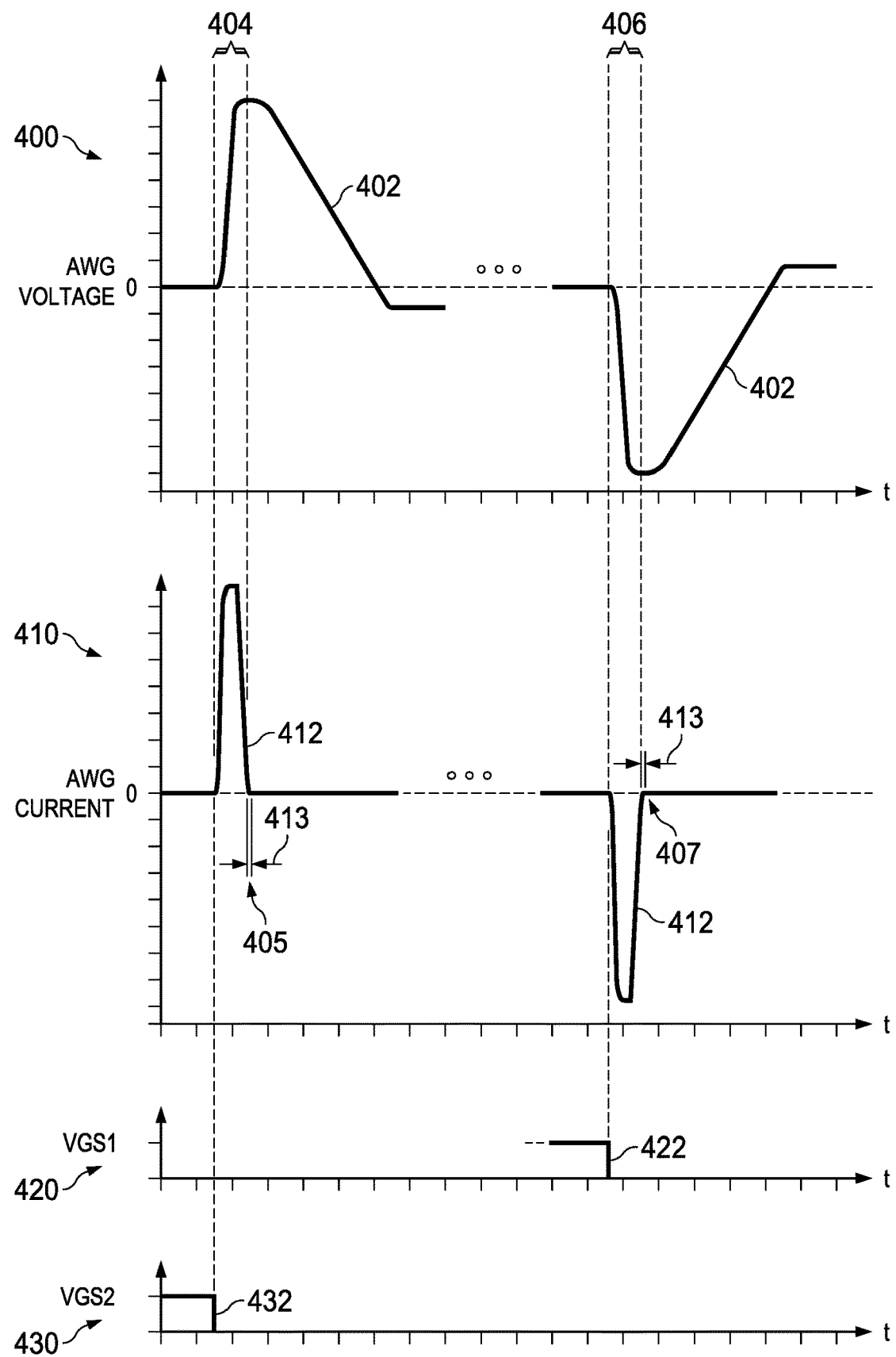
FIG. 4 is a signal diagram of test pulse signals and gate control signals provided by waveform generator and gate control circuits of the wafer test probe card.

FIG. 4 shows graphs 400, 410, 420 and 430 of waveform generator voltages, currents, and gate control signals during UIS test pulses provided by the waveform generator and gate control circuits 152 and 160 in FIG. 1 during testing in the system 300 according to the method 200. A graph 400 in FIG. 4 includes a waveform generator output voltage curve 402 (labeled "AWG VOLTAGE" in the drawing). The waveform generator circuit 152 provides a positive first pulse signal 404 to the first and second waveform generator outputs 154, 156 to test the second transistor 102 of FIG. 1 (e.g., at 208 in FIG. 2 above). The pulses in one example are provided as controlled currents. In the illustrated example, the waveform generator circuit 152 provides a negative first discharge pulse signal 405 to the first and second waveform generator outputs 154, 156 at the end of the first pulse signal 404 to discharge the second transistor 102 (e.g., at 210 in FIG. 2).

The waveform generator circuit 152 provides a negative second pulse signal 406 to the first and second waveform generator outputs 154, 156 to test the first transistor 101 (e.g., at 212 in FIG. 2). In the illustrated example, the waveform generator circuit 152 provides a positive second discharge pulse signal 407 to the first and second waveform generator outputs 154, 156 at the end of the second pulse signal 406 to discharge the first transistor 101 (e.g., at 214 in FIG. 2).

The graph 410 shows a curve 412 of the current delivered by the waveform generator circuit 152 during the pulses 405-407, including short reverse polarity discharge pulses of durations 413 (e.g., 500 mA for 20 µs). Following the main UIS pulses 404 and 406, the source-source voltage across the back-to-back connected transistors 101 and 102 does not decay quickly due to lack of a low impedance discharge path, as shown in the voltage curve 402. In order to mitigate or prevent residual voltage stress to the sense transistors 121 and 122, the waveform generator circuit 152 provides the small discharge pulses 405 and 407 to discharge the voltage, leading to the decreasing voltage at the trailing portions of the pulses shown in the voltage curve 402. In one example, the waveform generator circuit 152 sinks current from the tested circuit at 405 with a duration 413 (e.g., a small negative discharge current pulse, not shown due to the Y axis scale of the drawing), and sources a small positive current of duration 413 to the tested circuit at 407 (e.g., a small positive discharge current pulse, not shown due to the Y axis scale of the drawing).

The graph 420 in FIG. 4 includes an example first gate control voltage curve 422 that shows a signal generated by the gate control circuit 160 at the first gate control output 162 to control the voltage at the first control node 111 (e.g., at the gate G1 of the first transistor 101). The graph 430 includes an example second gate control voltage curve 432 generated at the second gate control output 164 to control the voltage at the second control node 112 (e.g., at the second gate G2). In one example, the gate control circuit 160 provides a voltage signal (e.g., curve 422) to the first gate control output 162 to turn the first transistor 101 off before the waveform generator circuit 152 provides the second pulse signal 406 to the first and second waveform generator outputs 154, 156. In the illustrated example, the gate control circuit 160 provides a voltage signal (e.g., curve 432) to the second gate control output 164 to turn the second transistor 102 off before the waveform generator circuit 152 provides the first pulse signal 404.

Figure 5:
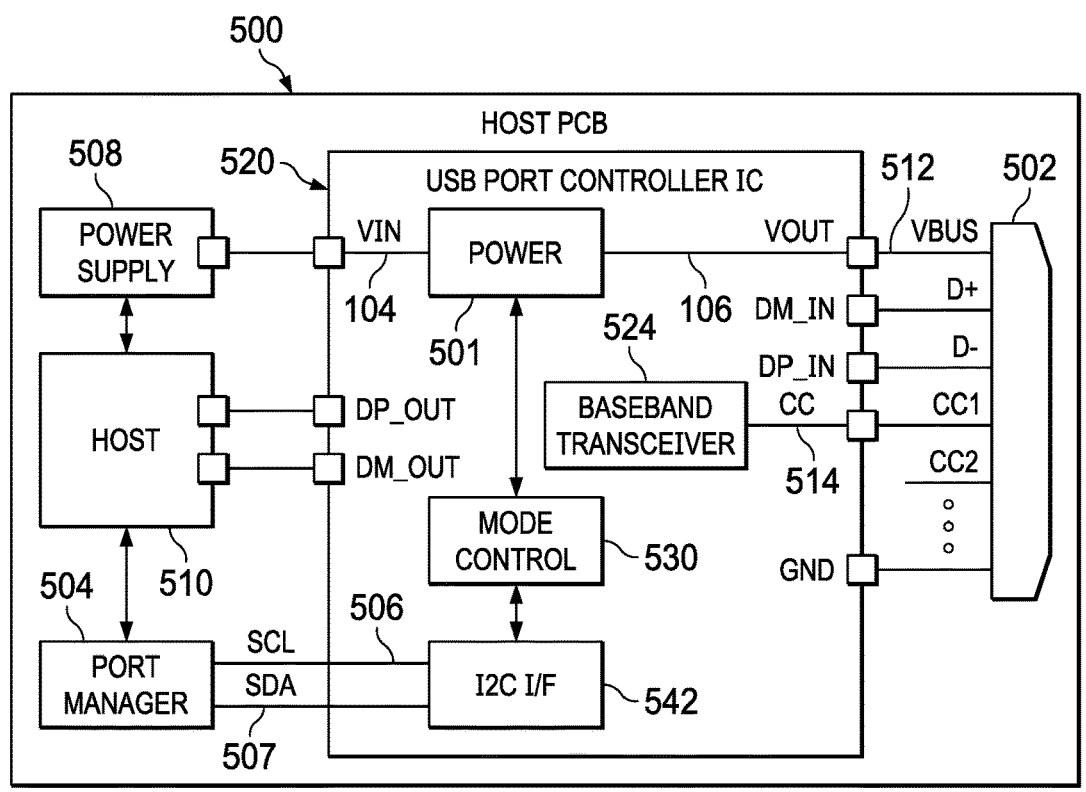
FIG. 5 is a schematic diagram of a USB port controller integrated circuit (IC).

FIG. 5 shows a USB power system with a power circuit 501. The power circuit 501 is an example implementation of the power circuit described above in connection with the wafer 100 in FIG. 1. The power circuit 501 in this example is formed in a USB port controller integrated circuit (IC) 520 after the wafer 100 is separated into individual integrated circuit dies, one of which is packaged to form the USB controller IC 520. The IC 520 includes an input node 104 to receive the input voltage signal VIN and an output node 106 to provide the output voltage signal VOUT as described above in connection with FIG. 1.

The USB system in FIG. 5 includes a host PCB 500 with a USB connector 502, and a port manager circuit 504 with serial clock and data lines 506 and 507 (e.g., respectively labeled SCL and SDA in FIG. 5). The host PCB 500 also includes a power supply 508, a host processor 510, and the USB port controller IC 520. The input node 104 receives the input voltage signal VIN from the power supply 508, and the output node 106 provides the output voltage signal VOUT to the USB port connector 502. The power circuit 501 generates the output voltage signal VOUT to provide a voltage bus signal (e.g., labeled VBUS) to the USB connector 502 via a circuit trace or connection 512 of the host PCB 500. The controller IC 520 includes further terminals (e.g., pins or pads) for additional connections to the USB connector 502. As discussed above, the power circuit 501 includes first and second transistors 101 and 102 connected back-to-back between the input node 104 and the output node 106. The host PCB 500 provides plus and minus data output connections DP_OUT and DM_OUT from the port controller IC 520 to the host processor 510, as well as terminals DM_IN and DP_IN connected to D+ and D− lines of the connector 502 that allow the host processor 510 to send and receive data packets. The controller IC 520 also provides a ground terminal GND for connection to a ground line of the USB connector 502.

In operation, the port controller 520 communicates with a connected USB device (not shown) using a baseband transceiver circuit 524 along one or more configuration channel (CC) lines 514 (e.g., CC1, CC2, etc.) to exchange data with the port manager circuit 504. The port controller IC 520 includes a low power mode control circuit 530 coupled with a communications interface circuit 542. The interface 542 and the mode control circuit 530 allow the port manager circuit 504 to set one or more operating modes of the power circuit (e.g., fast charging, slow charging, etc.), for example, based on protocol message exchanges between the USB port controller IC 520 and a connected USB device to determine intelligent charging levels. The power circuit 501 in one example operates during charging to protect the high side transistor (e.g., the second transistor 102 in FIG. 1) in response to detected output short circuits (e.g., VBUS shorted to GND) or other fault conditions as described above.

Figure 6:
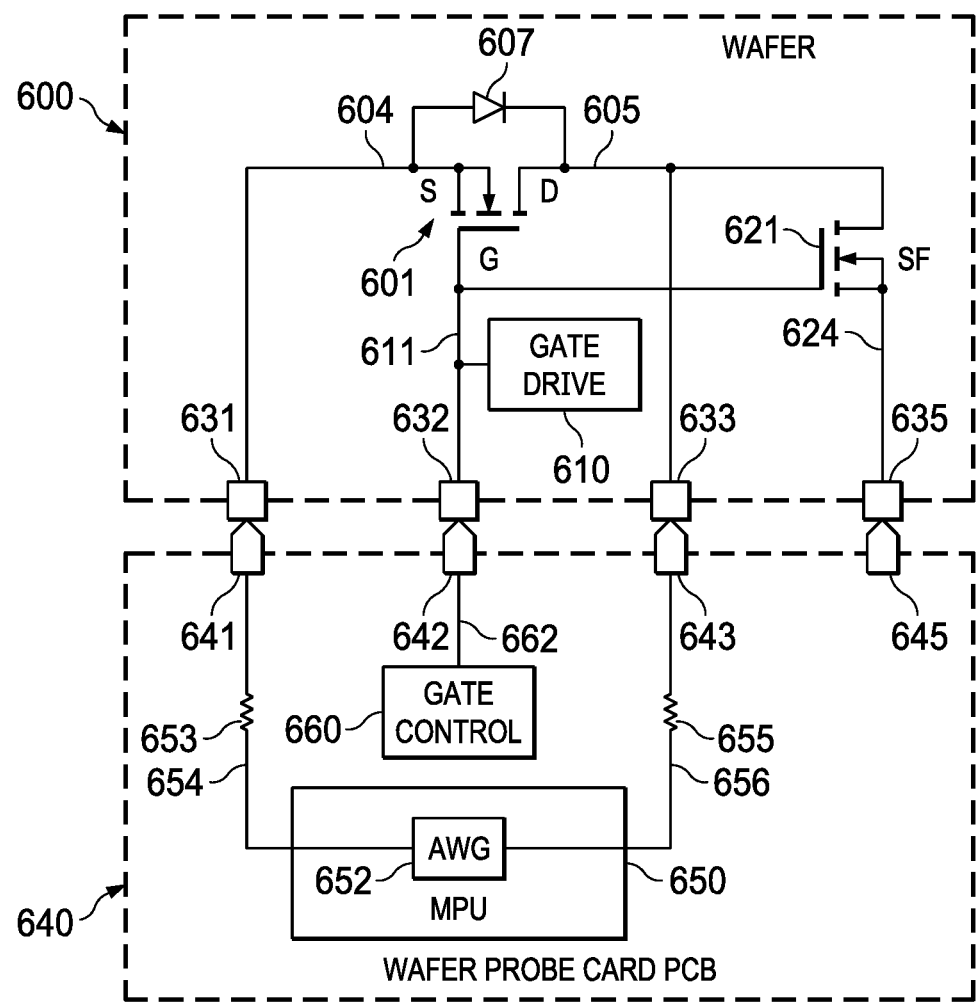
FIG. 6 is a schematic diagram of another wafer test probe card with probe needles engaged with a wafer.

FIG. 6 shows another example wafer 600 engaged by a wafer test probe card to test a single transistor 601 of a power circuit. The transistor 601 includes a first terminal (e.g., a drain labeled D in FIG. 6) that is connected to a first node 605, a second terminal (e.g., a source labeled S) that is connected to the input node 604, and a control terminal (e.g., a gate labeled G). The transistor 601 in this example includes a body diode 607, with an anode connected to the input node 604 and a cathode connected to the first node 605. The example wafer 600 in FIG. 6 includes a gate drive circuit 610 that provides a gate control signal to a control node 611 to control the transistor 601. The power circuit also includes a sense transistor 621 (e.g., a p-channel MOSFET labeled SF) with drain connected to the first node 605, a gate connected to the control node 611, and a source connected to a node 624. The wafer 600 is schematically shown engaged with probe needles of a wafer probe card 640 during wafer probe testing. The wafer probe testing in one example is implemented using the wafer probe testing system 300 of FIG. 3. As shown in FIG. 6, the wafer 600 also includes conductive pads 631-633 and 635, for example, copper or aluminum features exposed along a top side of the wafer 600 to allow electrical connection to one or more circuit nodes of the power circuit for wafer probe testing using an engaged wafer test probe card 640 (e.g., a PCB) with probe needles 641-643 and 645 positioned in locations corresponding to the respective conductive pads 631-633 and 635. The probe card 640 is positioned in FIG. 6 during wafer probe testing such that the conductive pads 631-633 and 635 are engaged by the corresponding probe needles 641-643 and 645.

Test circuitry of the wafer test probe card 640, including a processor circuit 650 and a gate control circuit 660, interact with the power circuit of the probed wafer 600 when the probe card 640 is positioned with the probe needles 641-643 and 645 electrically contacting (e.g., mechanically engaged with) the corresponding conductive pads 631-633 and 635. A first probe needle 641 is positioned to engage a first conductive pad 631 to couple with the source S of the first transistor 601 when the wafer 600 is engaged with the wafer test probe card 640. A second probe needle 642 is positioned to engage a second conductive pad 632 to couple with the gate G of the first transistor 601 when the wafer 600 is engaged with the wafer test probe card 640. A third probe needle 643 is positioned to engage a third conductive pad 633 to couple with the transistor drain D when the wafer 600 is engaged with the wafer test probe card 640. Another probe needle 645 is positioned to engage a conductive pad 635 of the wafer 600 to couple with the sense transistor source when the wafer 600 is engaged with the wafer test probe card 640. The probe card 640 includes a conductive path (e.g., trance(s) and/or via(s)) that electrically connect the probe needle 645 to the first probe needle 641 to protect the sense transistor 621, like the probe card 140 of FIG. 1 above.

The wafer test probe card 640 also includes a processor circuit 650 (e.gg., an MPU), with a waveform generator circuit 652 (e.g., an AWG). The waveform generator circuit 652 is configured to provide a pulse signal, such as a current pulse signal, to the first and third probe needles 641 and 643 to test the transistor 601 when the wafer 600 is engaged with the wafer test probe card 640. The waveform generator circuit 652 operates generally according to the method 200 of FIG. 2 with the steps at 208 and 210 omitted, including providing a pulse signal (e.g., pulse 406 in FIG. 4 above, at 212 in FIG. 2) to test the transistor 601. In one example, the waveform generator circuit 652 also provides a reverse polarity discharge pulse (e.g., pulse 407 in FIG. 4, at 214 in FIG. 2) to discharge the circuit at the end of the main pulse.

In the illustrated example, the wafer test probe card 640 includes a first ballast resistor 653 connected between a first output 654 of the waveform generator circuit 652 and the first probe needle 641, as well as a second ballast resistor 655 connected between a second output 656 of the waveform generator circuit 652 and the third probe needle 643. The ballast resistors 653, 655 protect the waveform generator circuit 652 and other circuitry of the wafer test probe card 640 during use, such as if one of the probe needles 641, 643 fails to properly engage the corresponding conductive pad 631, 633.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. A system, comprising:
   a chuck apparatus configured to support a wafer, the wafer having:
      a first transistor, including a first source connected to a first conductive pad, a first drain, and a first gate connected to a second conductive pad, and
      a second transistor, including a second source connected to a third conductive pad, a second drain connected to the first drain, and a second gate connected to a fourth conductive pad; and
   a probe card, including:
      a first probe needle,
      a second probe needle,
      a third probe needle,
      a waveform generator circuit, including a first waveform generator output coupled with the first probe needle, and a second waveform generator output coupled with the third probe needle, and
      a gate control circuit, including a first gate control output connected to the second probe needle; and
   a controller configured to position the chuck apparatus in a first position relative to the probe card to: engage the first probe needle with the first conductive pad, engage the second probe needle with the second conductive pad, and engage the third probe needle with the third conductive pad;

wherein the waveform generator circuit is configured to provide a first pulse signal of a first polarity to the first and second waveform generator outputs to test the second transistor, and to provide a second pulse signal of a second polarity to the first and second waveform generator outputs to test the first transistor.

2. The system of claim 1,
wherein the probe card further includes a fourth probe needle;
wherein the gate control circuit includes a second gate control output connected to the fourth probe needle; and
wherein the fourth probe needle engages the fourth conductive pad when the controller positions the chuck apparatus in the first position relative to the probe card.

3. The system of claim 2,
wherein the gate control circuit is configured to provide a voltage signal to the second gate control output to turn the second transistor off before the waveform generator circuit provides the first pulse signal to the first and second waveform generator outputs; and
wherein the gate control circuit is configured to provide another voltage signal to the first gate control output to turn the first transistor off before the waveform generator circuit provides the second pulse signal to the first and second waveform generator outputs.

4. The system of claim 2,
wherein the wafer includes a sense transistor, including a sense transistor source connected to a fifth conductive pad, a sense transistor drain connected to the first drain, and a sense transistor gate connected to the first gate;
wherein the probe card includes a fifth probe needle connected to the first probe needle; and
wherein the fifth probe needle engages the fifth conductive pad when the controller positions the chuck apparatus in the first position relative to the probe card.

5. The system of claim 1,
wherein the wafer includes a sense transistor, including a sense transistor source connected to a further conductive pad, a sense transistor drain connected to the first drain, and a sense transistor gate connected to the first gate;
wherein the probe card includes a further probe needle connected to the first probe needle; and
wherein the further probe needle engages the further conductive pad when the controller positions the chuck apparatus in the first position relative to the probe card.

6. The system of claim 5, wherein the probe card further includes a resistor connected between the first waveform generator output and the first probe needle.

7. The system of claim 6, wherein the waveform generator circuit is configured to provide a first discharge pulse signal of the second polarity to the first and second waveform generator outputs at the end of the first pulse signal to discharge the second transistor, and to provide a second discharge pulse signal of the first polarity to the first and second waveform generator outputs at the end of the second pulse signal to discharge the first transistor.

8. The system of claim 1, wherein the probe card further includes a resistor connected between the first waveform generator output and the first probe needle.

9. The system of claim 8, wherein the waveform generator circuit is configured to provide a first discharge pulse signal of the second polarity to the first and second waveform generator outputs at the end of the first pulse signal to discharge the second transistor, and to provide a second discharge pulse signal of the first polarity to the first and second waveform generator outputs at the end of the second pulse signal to discharge the first transistor.

10. The system of claim 1, wherein the waveform generator circuit is configured to provide a first discharge pulse signal of the second polarity to the first and second waveform generator outputs at the end of the first pulse signal to discharge the second transistor, and to provide a second discharge pulse signal of the first polarity to the first and second waveform generator outputs at the end of the second pulse signal to discharge the first transistor.

11. A wafer test probe card, comprising:
a first probe needle to couple with a first source of a first transistor of a wafer when the wafer is engaged with the wafer test probe card;
a second probe needle to couple with a first gate of the first transistor when the wafer is engaged with the wafer test probe card;
a third probe needle to couple with a first drain of the first transistor when the wafer is engaged with the wafer test probe card;
a waveform generator circuit configured to provide a pulse signal to the first and third probe needles to test the first transistor when the wafer is engaged with the wafer test probe card; and
a resistor connected between the waveform generator circuit and the first probe needle
wherein the waveform generator circuit is configured to provide the pulse signal of a first polarity to the first and third probe needles to test the first transistor, and to provide a discharge pulse signal of a second polarity to the first and third probe needles at the end of the pulse signal to discharge the first transistor.

12. The wafer test probe card of claim 11, further comprising a fourth probe needle to couple with a second gate of a second transistor of the wafer when the wafer is engaged with the wafer test probe card, wherein the third probe needle is configured to connect to a second source of the second transistor when the wafer is engaged with the wafer test probe card, and wherein a second drain of the second transistor is connected to the first drain of the first transistor.

13. The wafer test probe card of claim 12, wherein the waveform generator circuit is configured to provide a first pulse signal of a first polarity to the first and second waveform generator outputs to test the second transistor, and to provide a second pulse signal of a second polarity to the first and second waveform generator outputs to test the first transistor.

14. The wafer test probe card of claim 13, wherein the waveform generator circuit is configured to provide a first discharge pulse signal of the second polarity to the first and second waveform generator outputs at the end of the first pulse signal to discharge the second transistor, and to provide a second discharge pulse signal of the first polarity to the first and second waveform generator outputs at the end of the second pulse signal to discharge the first transistor.

15. The wafer test probe card of claim 14, further comprising a gate control circuit with a first gate control output connected to the second probe needle, and a second gate control output connected to the fourth probe needle, the gate control circuit, the gate control circuit being configured to:
provide a voltage signal to the second gate control output to turn the second transistor off before the waveform generator circuit provides the first pulse signal to the first and second waveform generator outputs, and provide another voltage signal to the first gate control output to turn the first transistor off before the waveform generator circuit provides the second pulse signal to the first and second waveform generator outputs.

16. The wafer test probe card of claim 12, wherein the resistor is connected between the first waveform generator output and the first probe needle; further comprising a second resistor connected between the second waveform generator output and the third probe needle.

17. The wafer test probe card of claim 11, wherein the waveform generator circuit is configured to provide the pulse signal of a first polarity to the first and third probe needles to test the first transistor, and to provide a discharge pulse signal of a second polarity to the first and third probe needles at the end of the pulse signal to discharge the first transistor.

18. The wafer test probe card of claim 11, further comprising a fifth probe needle to couple with a sense transistor source of a sense transistor of the wafer when the wafer is engaged with the wafer test probe card, the fifth probe needle being connected to the first probe needle.

19. A method of manufacturing an integrated circuit, the method including wafer probe testing of dies, comprising:

engaging a wafer with a wafer test probe card to couple a waveform generator circuit of the wafer test probe card to back-to-back connected first and second transistors of the wafer;

providing a first pulse signal of a first polarity to the back-to-back connected pair of transistors to test the second transistor;

providing a first discharge pulse signal of the second polarity to the first and second transistors at the end of the first pulse signal to discharge the second transistor; and separating the dies and constructing a packaged semiconductor device.

20. The method of claim 19, further comprising:

providing a second pulse signal of a second polarity to the back-to-back connected pair of transistors to test the first transistor; and providing a second discharge pulse signal of the first polarity to the first and second transistors at the end of the second pulse signal to discharge the first transistor.

* * * * *